(12) United States Patent
Wu et al.

(10) Patent No.: US 10,199,362 B1
(45) Date of Patent: Feb. 5, 2019

(54) MICROLED DISPLAY PANEL

(71) Applicant: Prilit Optronics, Inc., Tainan (TW)

(72) Inventors: Biing-Seng Wu, Tainan (TW); Chao-Wen Wu, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 0 days.

(21) Appl. No.: 15/871,696

(22) Filed: Jan. 15, 2018

(51) Int. Cl.
| | |
|---|---|
| *H01L 29/18* | (2006.01) |
| *H01L 25/16* | (2006.01) |
| *H01L 33/56* | (2010.01) |
| *H01L 33/54* | (2010.01) |
| *H01L 25/075* | (2006.01) |

(52) U.S. Cl.
CPC ........ *H01L 25/167* (2013.01); *H01L 25/0753* (2013.01); *H01L 33/54* (2013.01); *H01L 33/56* (2013.01)

(58) Field of Classification Search
None
See application file for complete search history.

(56) References Cited

U.S. PATENT DOCUMENTS

| | | | | |
|---|---|---|---|---|
| 6,822,269 | B2 * | 11/2004 | Horiuchi | H01L 33/486 257/100 |
| 8,846,424 | B2 * | 9/2014 | Li | H01L 25/0753 257/E33.073 |
| 9,368,549 | B1 * | 6/2016 | Oraw | H01L 27/156 |
| 2013/0111744 | A1 * | 5/2013 | Tischler | H01L 21/6835 29/832 |

* cited by examiner

*Primary Examiner* — Hung Vu
(74) *Attorney, Agent, or Firm* — Donald E. Stout; Stout, Uxa & Buyan, LLP

(57) ABSTRACT

A microLED display panel includes a substrate being divided into a plurality of sub-regions for supporting microLEDs, and a plurality of drivers being correspondingly disposed on surfaces of the sub-regions respectively. In one embodiment, a top surface of the substrate has a recess for accommodating the driver.

9 Claims, 5 Drawing Sheets

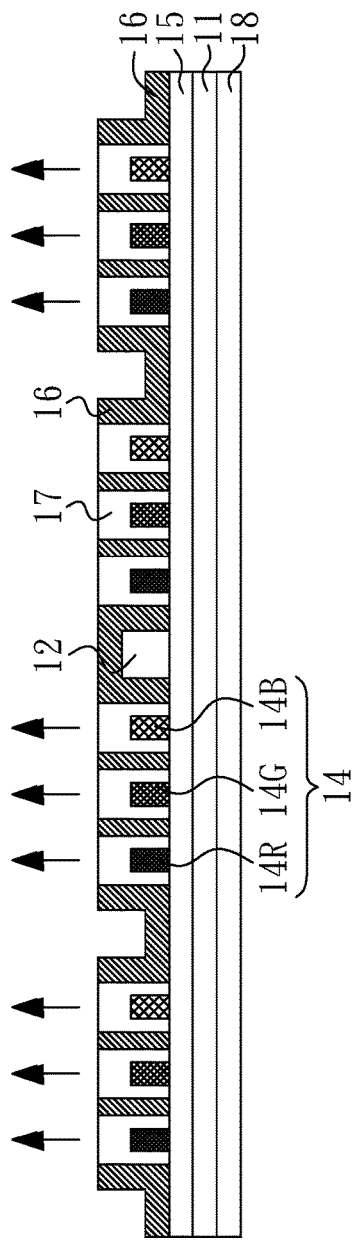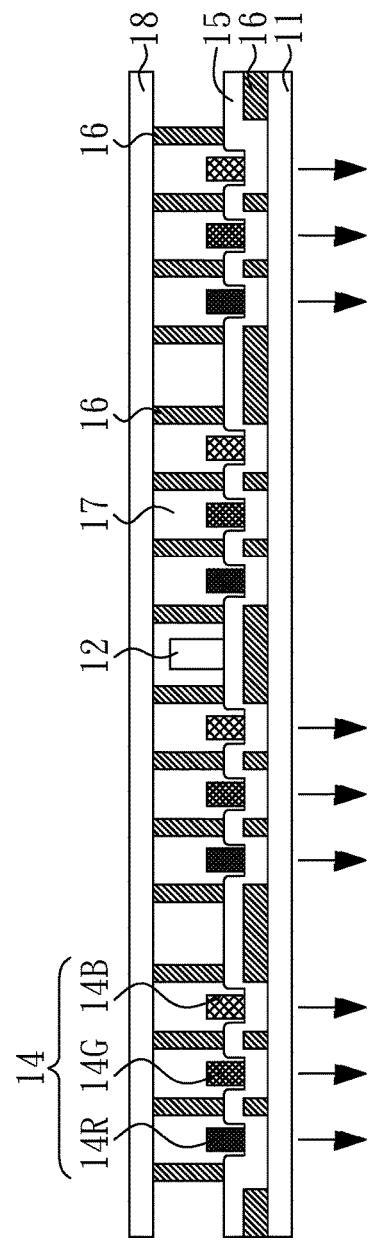

MICROLED DISPLAY PANEL

BACKGROUND OF THE INVENTION

1. FIELD OF THE INVENTION

The present invention generally relates to a display panel, and more particularly to a microLED display panel.

2. DESCRIPTION OF RELATED ART

A micro light-emitting diode (microLED, mLED or µLED) display panel is one of flat display panels, which is composed of microscopic microLEDs each of a size of 1-10 micrometers. Compared to conventional liquid crystal display panels, the microLED display panels offer better contrast, response times and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

Active matrix using thin-film transistors (TFT) may be used in companion with microLEDs to drive a display panel. However, microLED is made by flip chip technology, while TFT is made by complementary metal-oxide-semiconductor (CMOS) process which is more complex than flip chip technology. These two distinct technologies may cause thermal mismatch. A drive current of the microLED is small in gray display, which may be significantly affected by leakage current.

Passive matrix is another driving method performed by a row drive circuit and a column drive circuit, which are disposed on the periphery of a display panel. When the size or the resolution of the display panel increases, output loading and delay of the drive circuits increase accordingly, causing the display panel to malfunction. Therefore, passive matrix is not suitable for large-size microLED display panels.

A need has thus arisen to propose a novel microLED display panel, particularly a large-size or high-resolution display panel, which is capable of maintaining advantages of microLEDs and overcoming disadvantages of driving schemes.

SUMMARY OF THE INVENTION

In view of the foregoing, it is an object of the embodiment of the present invention to provide a microLED display panel capable of effectively reducing loading of drivers, thereby making whole large-size high-resolution microLED display panel feasible. Passive driving scheme is adopted in one embodiment to simplify the process of making display panels, reduce turn-on time of the microLEDs, increase drive current, and effectively minimize effect on gray display due to leakage current.

According to one embodiment, a microLED display panel includes a plurality of microLEDs, a substrate and a plurality of drivers. The substrate is utilized for supporting the microLEDs, and the substrate is divided into a plurality of sub-regions. The drivers are correspondingly disposed on surfaces of the sub-regions respectively. In one embodiment, the microLEDs are driven by a passive driving method. The driver includes a column drive circuit, which transmits column drive signals to first electrodes of the microLEDs on same columns via column conductive wires; and a row drive circuit, which transmits row drive signals to second electrodes of the microLEDs on same rows via row conductive wires.

According to another embodiment, a microLED display panel includes a plurality of microLEDs, at least one integrated circuit and a substrate. The substrate supports the microLEDs and the integrated circuit, and a top surface of the substrate has a recess for accommodating the integrated circuit.

BRIEF DESCRIPTION OF THE DRAWINGS

FIG. 3 shows a cross-sectional view illustrated of a frontside illuminating microLED display panel according to a first specific embodiment of the present invention;

FIG. 4 shows a cross-sectional view illustrated of a backside illuminating microLED display panel according to a second specific embodiment of the present invention;

DETAILED DESCRIPTION OF THE INVENTION

Figure 1A:
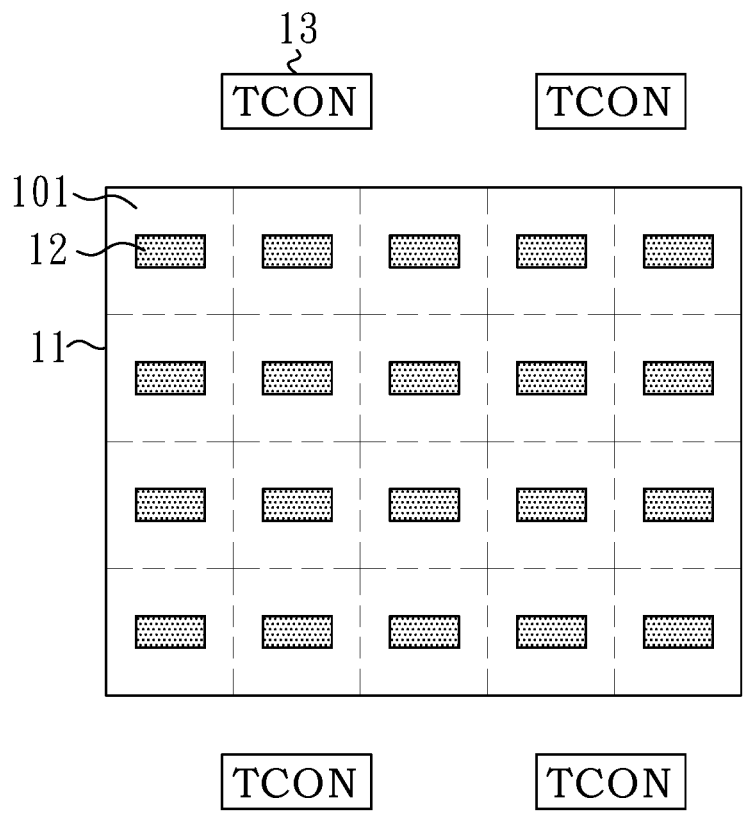
FIG. 1A shows a top view illustrated of a microLED display panel according to one embodiment of the present invention.
Figure 1B:
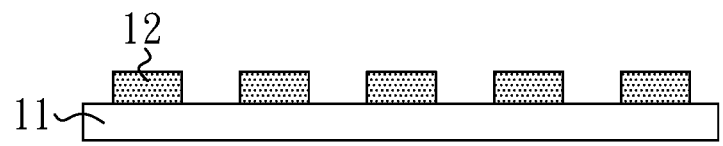
FIG. 1B shows a side view illustrated of the microLED display panel of FIG. 1A.

FIG. 1A shows a top view illustrated of a micro light-emitting diode (microLED) display panel 100 according to one embodiment of the present invention, and FIG. 1B shows a side view illustrated of the microLED display panel 100 of FIG. 1A. The microLED display panel of the embodiment is preferably adaptable to a large-size and high-resolution (e.g., 3840RGBx2160) display panel. In the specification, the size range of the microLED is between 1 and 10 micrometers. However, the size of the microLED may be even smaller due to specific applications or technological advance. In the specification, "large-size" display panel is currently and commonly referred to 10 inches or above display panel. However, "large-size" display panel may be referred to other display size due to specific applications or technological advance. In the specification, "high-resolution" display panel is currently and commonly referred to a display panel with 1080 or above scan lines. However, "high-resolution" display panel may be referred to other amount of scan lines due to specific applications or technological advance.

In the embodiment, the microLED display panel 100 may include a substrate 11 for supporting a plurality of microLEDs (now shown). The substrate 11 may be preferably made of an insulating material (e.g., glass or Acrylic) or other materials suitable for supporting the microLEDs.

According to one aspect of the embodiment, a surface of the substrate 11 is divided into a plurality of sub-regions

101. It is noted that the divided sub-regions 101 are not physically cut through, and the substrate 11 is not made by integrating the sub-regions 101. In other words, the substrate 11 or the microLED display panel 100 is a single or whole entity, or an uncut entity. FIG. 1A shows a simplified example of how the substrate 11 is divided into sub-regions 101. Take a microLED display panel 100 with resolution 3840RGBx2160 as an example, the substrate 11 may be divided into 80×54 sub-regions 101, each having resolution 48RGBx40. Nevertheless, this microLED display panel 100 may be divided into more or less sub-regions 101.

According to another aspect of the embodiment, the microLED display panel 100 may include a plurality of drivers 12, which are correspondingly disposed on (e.g., top) surfaces of the sub-regions 101 respectively. The driver 12 as exemplified in FIG. 1A may, but not necessarily, be disposed in the center of the surface of corresponding sub-region 101. Each sub-region 101 as exemplified in FIG. 1A has one corresponding driver 12. However, in other embodiments, each sub-region 101 may have plural corresponding drivers 12. The driver 12 of the embodiment may be manufactured as an integrated circuit or chip, which is then bonded on the surface of the sub-region 101, for example, by surface-mount technology (SMT) such as chip-on-glass (COG) or flip chip. In one example, the drivers 12 and the microLEDs are disposed on the same surface of the substrate 11.

The microLED display panel 100 of the embodiment may further include a plurality of timing controllers (TCON) 13, which are electrically connected with the substrate 11, for example, via a flexible printed circuit board (FPCB), and are further electrically connected with corresponding drivers 12, for example, via signal traces (not shown) disposed on the substrate 11. In the embodiment, one timing controller 13 may be electrically connected with at least two drivers 12. In other words, the amount of the timing controllers 13 may be less than the amount of the drivers 12. The timing controller 13 may be electrically connected directly with corresponding drivers 12 via signal traces. Alternatively, the timing controller 13 may be electrically connected to one driver 12 via signal traces, and, after signal buffering, then be electrically connected to another driver 12 via signal traces.

Figure 2:
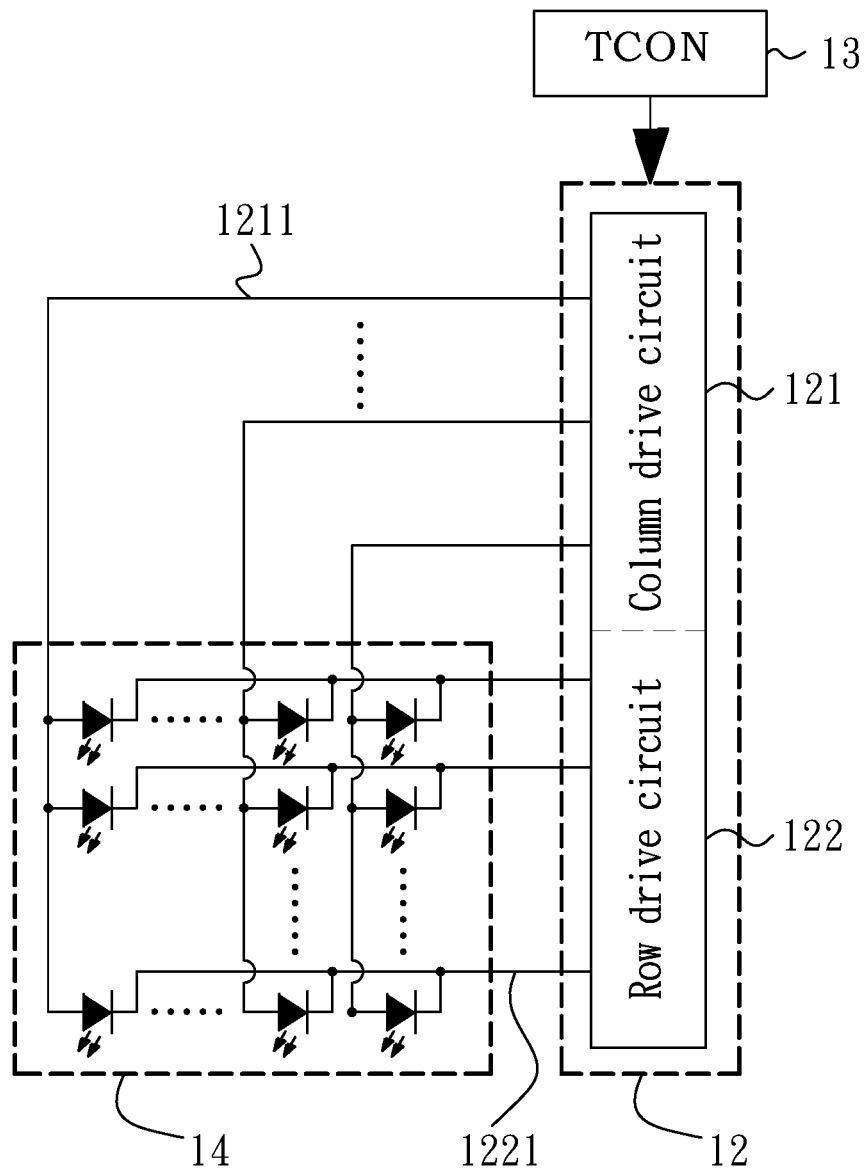
FIG. 2 shows a schematic diagram illustrated of passive driving the microLED display panel.

According to a further aspect of the embodiment, the microLED display panel 100 may adopt passive driving method for driving the microLEDs. FIG. 2 shows a schematic diagram illustrated of passive driving the microLED display panel 100. The timing controller 13 transmits timing control signals and data signals to the driver 12. The driver 12 may include a column drive circuit 121 and a row (or scan) drive circuit 122. The column drive circuit 121 transmits column drive signals to first electrodes (e.g., anodes) of the microLEDs 14 on the same columns via column conductive wires 1211, and the row drive circuit 122 transmits row drive signals to second electrodes (e.g., cathodes) of the microLEDs 14 on the same rows via row conductive wires 1221. In the embodiment, the column drive circuit 121 and the row drive circuit 122 are made in a single integrated circuit.

According to the embodiment discussed above, the substrate 11 of the microLED display panel 100 is divided into sub-regions 101, each of which has a corresponding driver 12. Therefore, loading of the column drive circuit 121 and the row drive circuit 122 may be effectively reduced, thereby making whole large-size high-resolution microLED display panel feasible. Moreover, the microLED display panel 100 of the embodiment adopts a passive driving method (instead of active driving method using thin-film transistors) for driving the microLEDs 14, thereby simplifying the process of making display panels, reducing turn-on time of the microLEDs 14, increasing drive current, and effectively minimizing effect on gray display due to leakage current.

FIG. 3 shows a cross-sectional view illustrated of a frontside illuminating microLED display panel 300 according to a first specific embodiment of the present invention. In the embodiment, the microLEDs 14 and the driver 12 are disposed above a top surface of the substrate 11. Light generated by the microLEDs 14 primarily emits upward (i.e., frontside illuminating) from the top surface of the substrate 11 as indicated by arrows.

As exemplified in FIG. 3, each pixel may include a red microLED 14R, a green microLED 14G and a blue microLED 14B. A trace layer 15 is disposed between a (e.g., top) surface of the substrate 11 and the microLEDs 14 and the driver 12. The trace layer 15 is configured to electrically connect the driver 12, the microLEDs 14 and the timing controller 13. A light blocking layer 16 is disposed between adjacent pixels and above the trace layer 15. The light blocking layer 16 of the embodiment may be made of black matrix (BM) or other materials suitable for blocking light. In one embodiment, the light blocking layer 16 may be optionally disposed among the red microLED 14R, the green microLED 14G and the blue microLED 14B of the same pixel.

A light guide layer 17 may be disposed above the red microLED 14R, the green microLED 14G and the blue microLED 14B. The frontside illuminating microLED display panel 300 of the embodiment may further include a cover plate 18 disposed on a bottom surface of the substrate 11. The cover plate 18 of the embodiment may be made of an opaque material.

FIG. 4 shows a cross-sectional view illustrated of a backside illuminating microLED display panel 400 according to a second specific embodiment of the present invention. In the embodiment, the microLEDs 14 and the driver 12 are disposed above a top surface of the substrate 11. Light generated by the microLEDs 14 primarily emits downward (i.e., backside illuminating) from the bottom surface of the substrate 11 as indicated by arrows.

As exemplified in FIG. 4, each pixel may include a red microLED 14R, a green microLED 14G and a blue microLED 14B. A light blocking layer 16 is disposed between adjacent pixels and above a (e.g., top) surface of the substrate 11. The light blocking layer 16 of the embodiment may be made of black matrix (BM) or other materials suitable for blocking light. A trace layer 15 is disposed above the light blocking layer 16 for electrically connecting the driver 12, the microLEDs 14 and the timing controller 13. In one embodiment, the light blocking layer 16 may be optionally disposed among the red microLED 14R, the green microLED 14G and the blue microLED 14B of the same pixel.

A light guide layer 17 may be disposed above the red microLED 14R, the green microLED 14G and the blue microLED 14B. The backside illuminating microLED display panel 400 of the embodiment may further include a cover plate 18 disposed above the driver 12, the trace layer 15, the light blocking layer 16 and the light guide layer 17. The cover plate 18 of the embodiment may be made of an opaque material.

Figure 5:
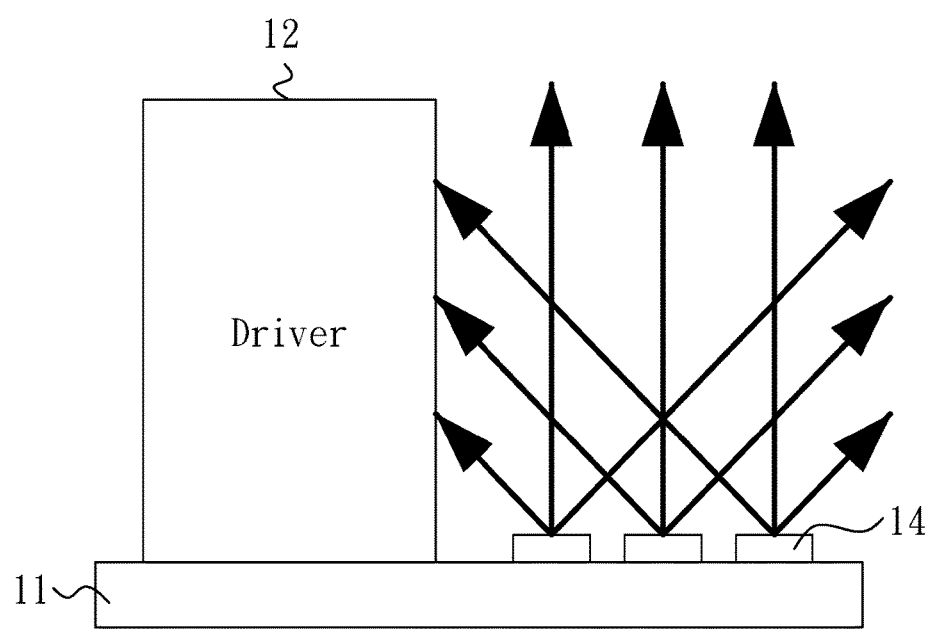
FIG. 5 shows a partial enlarged view illustrating a substrate, a driver and microLEDs.

FIG. 5 shows a partial enlarged view illustrating a substrate 11, a driver 12 and microLEDs 14, in which the driver 12 and the microLEDs 14 are disposed on a top surface of the substrate 11. Generally speaking, an integrated circuit (e.g., the driver 12) has a height substantially greater than a height of the microLEDs 14. For example, the driver 12 has a height of 150 micrometers, the microLEDs 14 have a height of 10 micrometers, and the substrate 11 has a height of 500-1100 micrometers. As the driver 12 is substantially higher than (e.g., ten times) the microLEDs 14, light generated by the microLEDs 14 emitting upward from the top surface of the substrate 11 as indicated by arrows may probably be blocked by the neighboring driver 12, thus reducing light intensity at some angles of view. In order to solve this problem, some embodiments are proposed as follows.

Figure 6A:
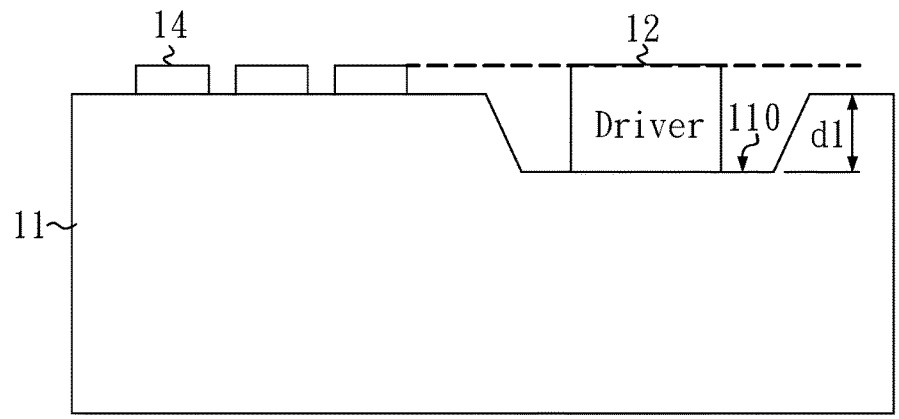
FIG. 6A shows a partial enlarged side view of a microLED display panel according to a first embodiment of the present invention.

FIG. 6A shows a partial enlarged side view of a microLED display panel according to a first embodiment of the present invention. In the embodiment, a top surface of the substrate 11 has a recess 110 for accommodating an integrated circuit (e.g., the driver 12). In the embodiment, a sum of a depth d1 of the recess 110 and a height of the microLED 14 is substantially equal to a height of the driver 12. Accordingly, a top surface of the driver 12 and the top surface of the microLED 14 are at a substantially same level. Compared with the microLED display panel shown in FIG. 5, light emitted from the microLEDs 14 of the embodiment is not blocked by the neighboring driver 12.

Figure 6B:
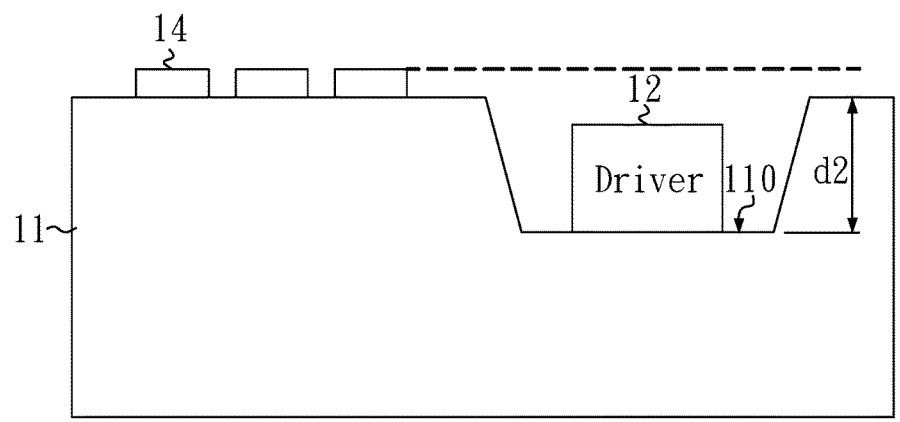
FIG. 6B shows a partial enlarged side view of a microLED display panel according to a second embodiment of the present invention.

FIG. 6B shows a partial enlarged side view of a microLED display panel according to a second embodiment of the present invention. In the embodiment, a top surface of the substrate 11 has a recess 110 for accommodating an integrated circuit (e.g., the driver 12). In the embodiment, a depth d2 of the recess 110 is greater than a height of the driver 12. Accordingly, a top surface of the driver 12 is at a level lower than a top surface of the microLED 14. Compared with the microLED display panel shown in FIG. 5, light emitted from the microLEDs 14 of the embodiment is not blocked by the neighboring driver 12.

Figure 6C:
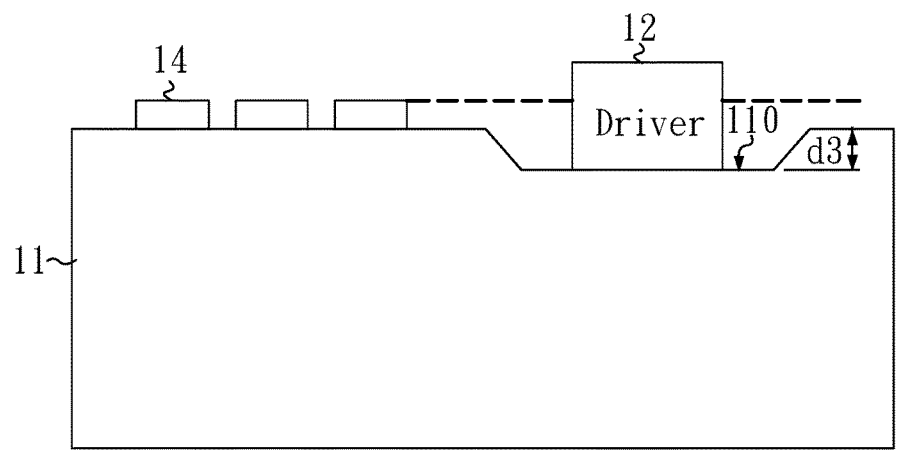
FIG. 6C shows a partial enlarged side view of a microLED display panel according to a third embodiment of the present invention.

FIG. 6C shows a partial enlarged side view of a microLED display panel according to a third embodiment of the present invention. In the embodiment, a top surface of the substrate 11 has a recess 110 for accommodating an integrated circuit (e.g., the driver 12). In the embodiment, a sum of a depth d3 of the recess 110 and a height of the microLED 14 is less than a height of the driver 12. Accordingly, a top surface of the driver 12 is at a level higher than a top surface of the microLED 14. Compared with the microLED display panel shown in FIG. 5, substantially less light emitted from the microLEDs 14 of the embodiment is blocked by the neighboring driver 12.

According to the embodiments discussed above, one may design recesses with different depths for accommodating integrated circuits with different heights according to the heights of the integrated circuits, respectively. One may design a groove with plural recesses according to the integrated circuit with the maximum height for accommodating integrated circuits with different heights.

Although specific embodiments have been illustrated and described, it will be appreciated by those skilled in the art that various modifications may be made without departing from the scope of the present invention, which is intended to be limited solely by the appended claims.

What is claimed is:

1. A micro light-emitting diode (microLED) display panel, comprising:
   a plurality of microLEDs;
   a substrate for supporting the microLEDs, the substrate being divided into a plurality of sub-regions; and
   a plurality of drivers being correspondingly disposed on surfaces of the sub-regions respectively;
   wherein a top surface of the substrate has a recess for accommodating the driver.

2. The microLED display panel of claim 1, wherein a sum of a depth of the recess and a height of the microLED is substantially equal to a height of the driver.

3. The microLED display panel of claim 1, wherein a sum of a depth of the recess and a height of the microLED is greater than a height of the driver.

4. The microLED display panel of claim 1, wherein a sum of a depth of the recess and a height of the microLED is less than a height of the driver.

5. A micro light-emitting diode (microLED) display panel, comprising:
   a plurality of microLEDs;
   at least one integrated circuit; and
   a substrate for supporting the microLEDs and the integrated circuit, a top surface of the substrate having a recess for accommodating the integrated circuit.

6. The microLED display panel of claim 5, wherein the integrated circuit comprises a driver.

7. The microLED display panel of claim 5, wherein a sum of a depth of the recess and a height of the microLED is substantially equal to a height of the integrated circuit.

8. The microLED display panel of claim 5, wherein a sum of a depth of the recess and a height of the microLED is greater than a height of the integrated circuit.

9. The microLED display panel of claim 5, wherein a sum of a depth of the recess and a height of the microLED is less than a height of the integrated circuit.

* * * * *